United States Patent
Li

(10) Patent No.: US 8,559,189 B2
(45) Date of Patent: Oct. 15, 2013

(54) RISER CARD FOR POWER SUPPLY

(75) Inventor: Zhan-Yang Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 363 days.

(21) Appl. No.: 13/070,895

(22) Filed: Mar. 24, 2011

(65) Prior Publication Data

US 2012/0026710 A1 Feb. 2, 2012

(30) Foreign Application Priority Data

Jul. 28, 2010 (CN) .......................... 2010 1 0239160

(51) Int. Cl.
*H05K 1/11* (2006.01)
*H05K 1/14* (2006.01)
*H05K 1/00* (2006.01)

(52) U.S. Cl.
USPC ............. 361/803; 361/796; 361/785; 439/65; 439/79

(58) Field of Classification Search
USPC ................. 361/785, 801, 803, 796, 737, 788, 361/679.51; 439/65, 79
See application file for complete search history.

(56) References Cited

U.S. PATENT DOCUMENTS

| | | | | |
|---|---|---|---|---|
| 5,260,854 A * | 11/1993 | Hileman et al. | .............. | 361/736 |
| 5,740,020 A * | 4/1998 | Palatov | .......................... | 361/796 |
| 5,963,431 A * | 10/1999 | Stancil | .......................... | 361/803 |
| 6,018,458 A * | 1/2000 | Delia et al. | ..................... | 361/690 |
| 6,496,384 B1 * | 12/2002 | Morales et al. | ............... | 361/784 |
| 6,731,515 B2 * | 5/2004 | Rhoads | .......................... | 361/796 |
| 6,999,319 B2 * | 2/2006 | Wu et al. | ....................... | 361/724 |
| 7,019,984 B2 * | 3/2006 | Driscoll et al. | ............... | 361/788 |
| 7,027,305 B2 * | 4/2006 | Keating et al. | ................ | 361/719 |
| 7,273,379 B2 * | 9/2007 | Jang et al. | ........................ | 439/65 |
| 8,102,671 B2 * | 1/2012 | Goldstein et al. | ............. | 361/803 |
| 8,277,229 B2 * | 10/2012 | Chiu et al. | ....................... | 439/65 |
| 8,315,066 B2 * | 11/2012 | Chen et al. | ..................... | 361/783 |
| 2002/0071259 A1 * | 6/2002 | Roos | ............................. | 361/784 |
| 2002/0141170 A1 * | 10/2002 | Rhoads | .......................... | 361/796 |
| 2004/0257763 A1 * | 12/2004 | Andresen et al. | ............ | 361/687 |
| 2008/0055876 A1 * | 3/2008 | Fan et al. | ....................... | 361/801 |
| 2008/0298030 A1 * | 12/2008 | Fan et al. | ....................... | 361/759 |
| 2009/0034222 A1 * | 2/2009 | Smith et al. | .................... | 361/803 |
| 2009/0073645 A1 * | 3/2009 | Tsai et al. | .................... | 361/679.6 |
| 2011/0250766 A1 * | 10/2011 | Chiu et al. | ....................... | 439/65 |
| 2011/0273853 A1 * | 11/2011 | Tsai et al. | ..................... | 361/748 |
| 2013/0024591 A1 * | 1/2013 | Sun | ................................ | 710/301 |

\* cited by examiner

*Primary Examiner* — Adrian S Wilson
*Assistant Examiner* — Abhishek Rathod
(74) *Attorney, Agent, or Firm* — Altis & Wispro Law Group, Inc.

(57) ABSTRACT

A riser card is used for connecting at least one power supply to a motherboard in an electronic device. The riser card includes a first printed circuit board (PCB) and a second PCB. The first PCB includes at least one power connector for laterally receiving the at least one power supply. The second PCB is located parallel to the first PCB. The second PCB includes an insert terminal for connecting to the motherboard. The first PCB is spaced from the second PCB, and the first PCB and the second PCB are electrically connected.

16 Claims, 4 Drawing Sheets

RISER CARD FOR POWER SUPPLY

BACKGROUND

1. Technical Field

The present disclosure relates to riser cards, and more particularly to a riser card for connecting a power supply in an electronic device.

2. Description of Related Art

Often, a motherboard of a computer usually has only one power connector, and one power supply, which is directly connected to the motherboard. In this way, the position of the power supply is usually still relative to the motherboard. Otherwise, the only power supply may fail during extensive use. The computer has to be shut down to renew the power supply, and work done with the computer will be interrupted. In this case, one or more power supplies may be further used in the computer. Therefore, a riser card that can electrically connect one or more power supplies to the motherboard is needed.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
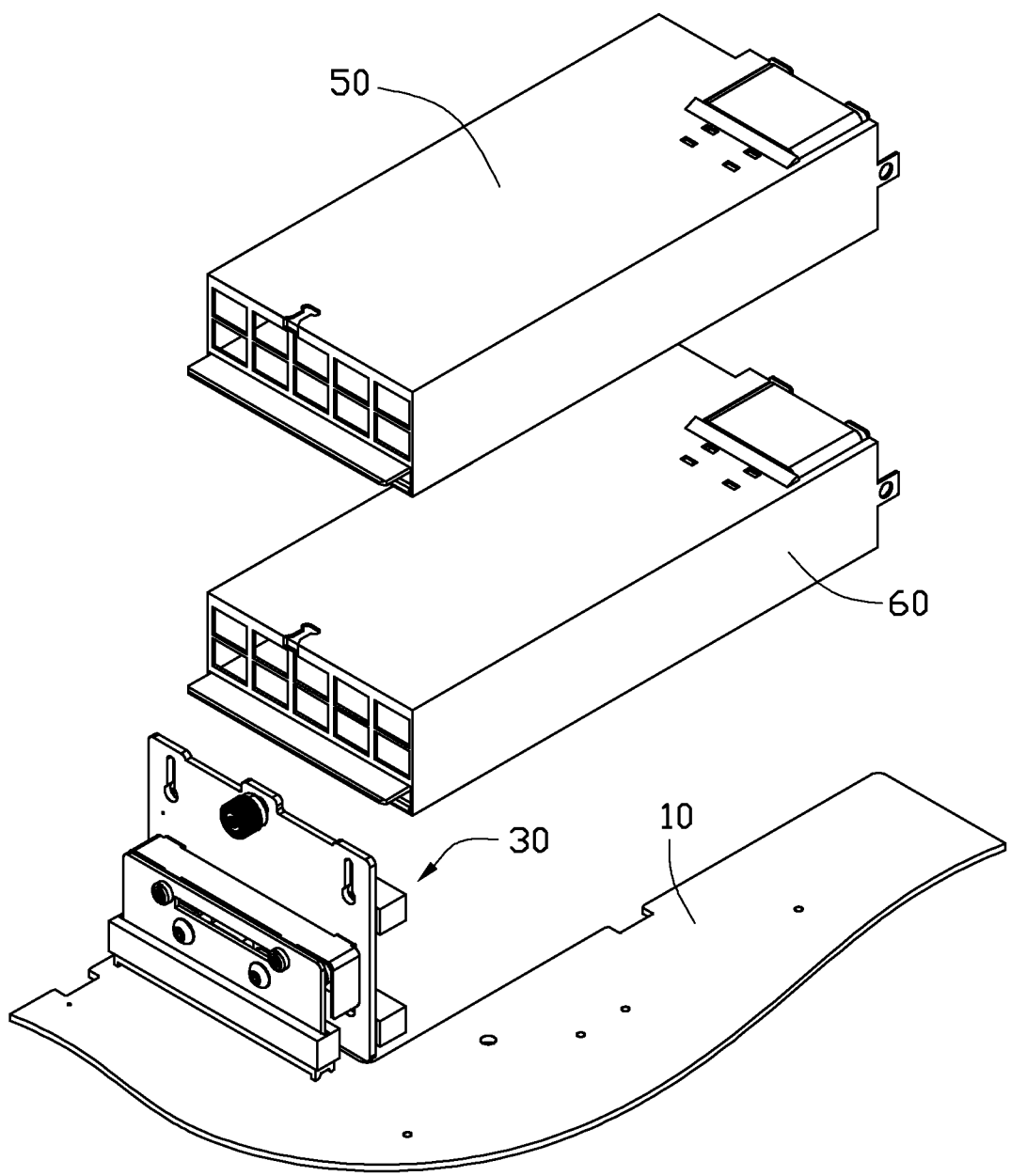
FIG. 1 is an exploded, isometric view of an embodiment of a riser card, a motherboard, and two power supplies of an electronic device.

Referring to FIG. 1, one embodiment of a riser card 30 is used to make a parallel connection of a first power supply 50 and a second power supply 60 to a motherboard 10 in an electronic device. The electronic device may work uninterruptedly when either one of the first power supply 50 or the second power supply 60 is invalid.

Figure 2:
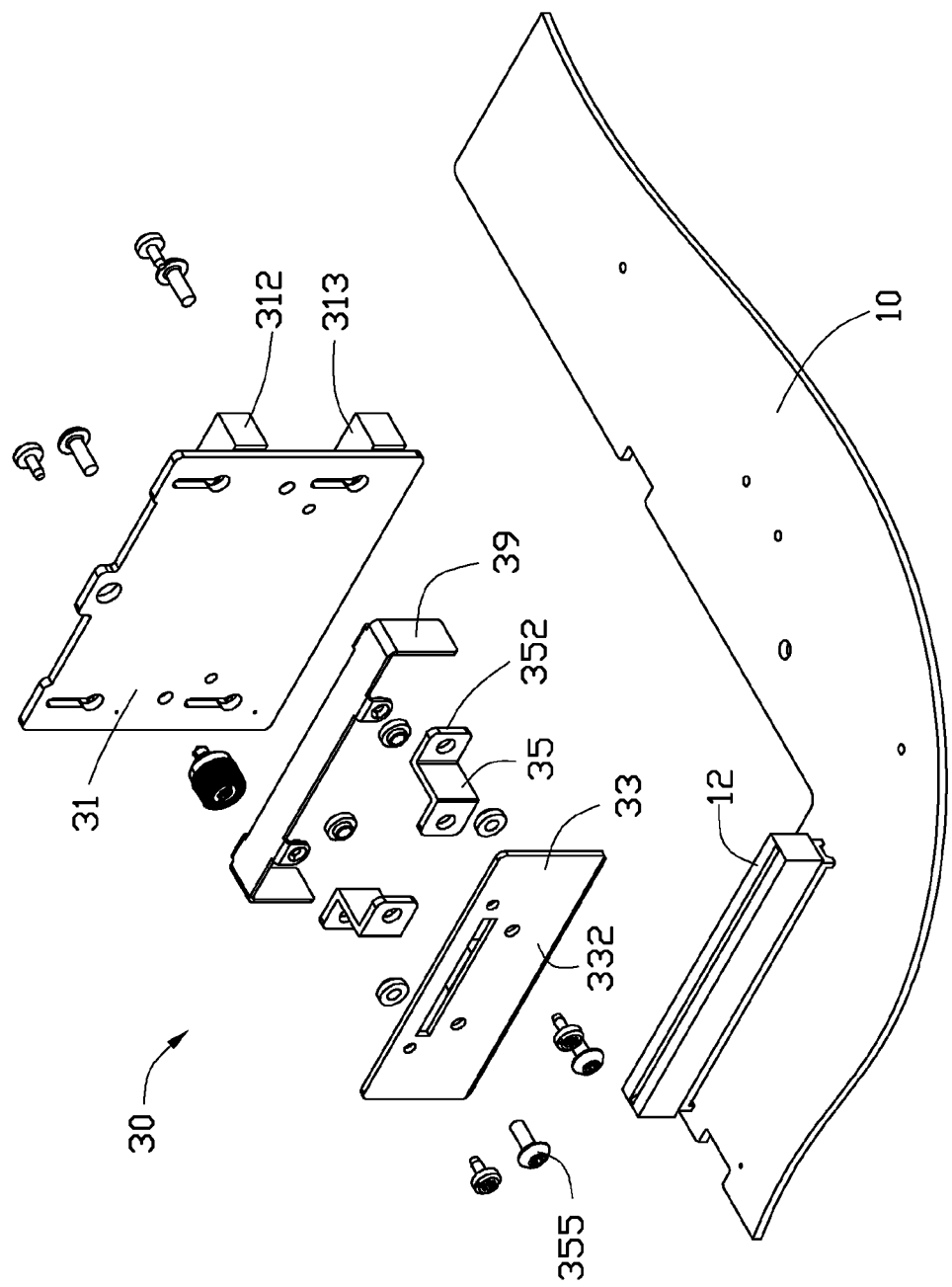
FIG. 2 is an isometric view of FIG. 1.
Figure 3:
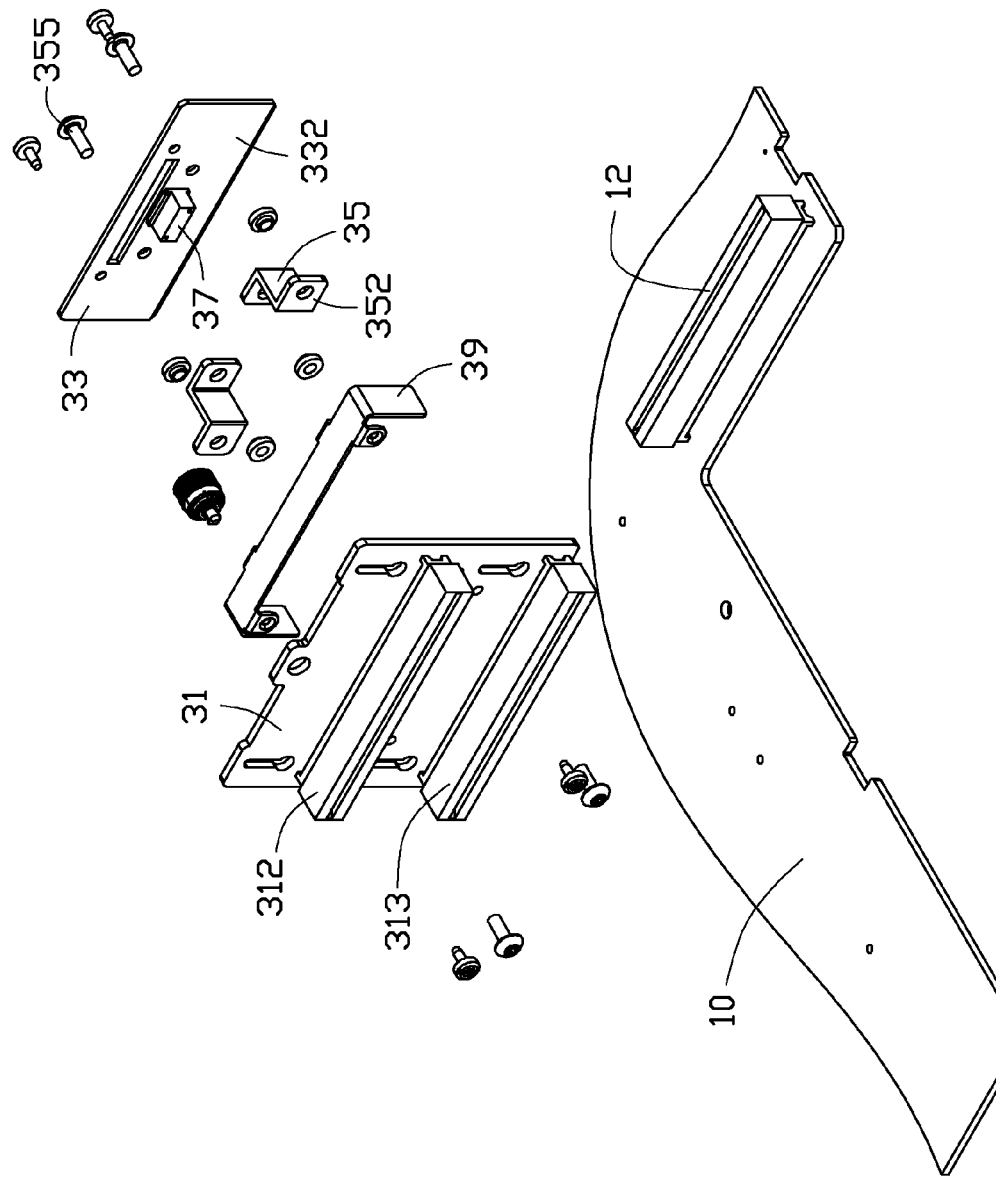
FIG. 3 is similar to FIG. 1, but shown from another aspect.

Referring also to FIG. 2 and FIG. 3, the riser card 30 includes a first printed circuit board (PCB) 31, a second PCB 33, two electric connecting members 35, a signal connector 37 and a baffle plate 39.

The first PCB 31 and the second PCB 33 are spaced and located in parallel. The height of the first PCB 31 is larger than that of the second PCB 33. In one embodiment, the first PCB 31 includes a first power connector 312 and a second power connector 313 to couple the first power connector 312 and the second power connector 313. The first power connector 312 and the second power connector 313 extend toward a direction that is opposite to the second PCB 33. The second PCB 33 includes an insert terminal 332 for coupling to a card connector 12 of the motherboard 10.

The two electric connecting members 35 and the signal connector 37 are located between the first PCB 31 and the second PCB 33. The two electric connecting members 35 electrically connect the first PCB 31 to the second PCB 33. In one embodiment, each electric connecting member 35 is made of copper. Each electric connecting member 35 is Z-shaped. Each electric connecting member 35 includes two mounting portions 352 to fix to the first PCB 31 and the second PCB 33.

The signal connector 37 can communicate a signal between the first PCB 31 and the second PCB 33.

The baffle plate 39 covers the electric connecting members 35 and the signal connector 37. The baffle plate 39 is U-shaped. The baffle plate 39 can be mounted to the first PCB 31 at one side and can be mounted to the second PCB 33 at the other side. The baffle plate 39 is flushed with an outer edge of the second PCB 33.

Figure 4:
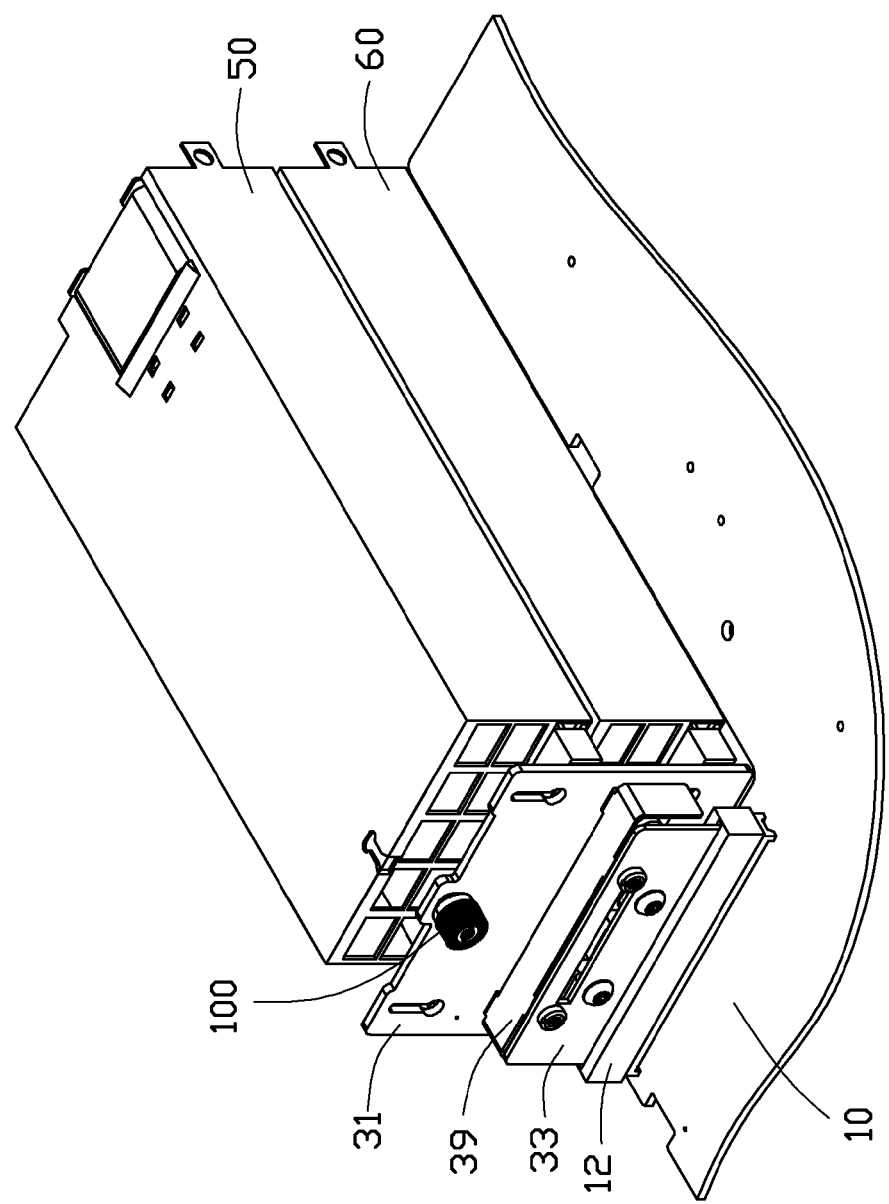
FIG. 4 is an assembled view of FIG. 1.

Referring to FIG. 4, in assembly, the electric connecting members 35, the signal connector 37, and the baffle plate 39 are respectively fixed to the first PCB 31 and the second PCB 33 through a plurality of screws 355. The baffle plate 39 covers and can protect the electric connecting members 35 and the signal connector 37. The first power connector 312 and the second power connector 313, and the second PCB 33 are located at opposite sides of the first PCB 31.

In use, the insert terminal 332 is plugged to the card connector 12 of the motherboard 10. The first power connector 312 and the second power connector 313 respectively receive the first power supply 50 and the second power supply 60. A thumb fastener 100 can be provided to further fix the first power supply 50 to the riser card 30. The electronic device then can employ either one of the first power supply 50 or the second power supply 60.

It is also to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A riser card comprising:
 a first printed circuit board (PCB) comprising at least one power connector for laterally receiving at least one power supply;
 a second PCB, parallel to the first PCB, comprising an insert terminal for connecting to a motherboard; and
 wherein the first PCB is spaced from the second PCB, and the first PCB and the second PCB are electrically connected, a signal connector is located between the first PCB and the second PCB to connect the first PCB to the second PCB, and a baffle plate covers the signal connector.

2. The riser card of claim 1, wherein the baffle plate is U-shaped.

3. The riser card of claim 1, wherein the baffle plate is mounted to the first PCB and the second PCB, and the baffle plate is flushed with an outer edge of the second PCB.

4. The riser card of claim 1, wherein an electric connecting member is located between the first PCB and the second PCB, and the electric connecting member connects the first PCB to the second PCB.

5. The riser card of claim 4, wherein the electric connecting member comprises copper.

6. The riser card of claim 1, wherein the height of the first PCB is greater than that of the second PCB.

7. The riser card of claim 1, wherein the at least one power connector extends towards a direction that is opposite to the second PCB.

8. An electronic device comprising:
- a motherboard;
- at least one power supply;
- a first printed circuit board (PCB), the first PCB comprising at least one power connector for laterally receiving the at least one power supply;
- a second PCB, parallel to the first PCB, comprising an insert terminal for connecting to the motherboard; and
- a baffle, the baffle plate being substantially flush with an outer edge of the second PCB;
- wherein the first PCB is spaced from the second PCB by the baffle, and the first PCB and the second PCB are electrically connected;
- wherein a signal connector is located between the first PCB and the second PCB to connect the first PCB to the second PCB, and the baffle plate is located around the signal connector.

9. The electronic device of claim 8, wherein the baffle plate is U-shaped.

10. The electronic device of claim 8, wherein the baffle plate is mounted to the first PCB and the second PCB.

11. The electronic device of claim 8, wherein an electric connecting member is located between the first PCB and the second PCB, and the electric connecting member connects the first PCB to the second PCB.

12. The electronic device of claim 11, wherein the electric connecting member comprises copper.

13. The electronic device of claim 8, wherein the height of the first PCB is greater than that of the second PCB.

14. The electronic device of claim 8, wherein the at least one power connector extends towards a direction that is opposite to the second PCB.

15. The electronic device of claim 11, wherein the electric connecting member is substantially Z-shaped.

16. An electronic device comprising:
- a motherboard;
- at least one power supply;
- a first printed circuit board (PCB), the first PCB comprising at least one power connector for laterally receiving the at least one power supply;
- a second PCB, parallel to the first PCB, comprising an insert terminal for connecting to the motherboard; and
- wherein the first PCB is spaced from the second PCB, and the first PCB and the second PCB are electrically connected, a signal connector is located between the first PCB and the second PCB to connect the first PCB to the second PCB, and a baffle plate covers the signal connector.

* * * * *